United States Patent [19]

Kuindersma et al.

[11] Patent Number: 4,995,048
[45] Date of Patent: Feb. 19, 1991

[54] TUNABLE SEMICONDUCTOR DIODE LASER WITH DISTRIBUTED REFLECTION

[75] Inventors: Pieter I. Kuindersma; Teunis Van Dongen, both of Eindhoven, Netherlands

[73] Assignee: U.S. Philips Corp., New York, N.Y.

[21] Appl. No.: 446,740

[22] Filed: Dec. 6, 1989

[30] Foreign Application Priority Data

Dec. 16, 1988 [NL] Netherlands .................. 8803080

[51] Int. Cl.$^5$ ................................. H01S 3/19
[52] U.S. Cl. ........................... 372/50; 372/96; 372/20
[58] Field of Search ............ 372/96, 29, 50, 43, 372/44

[56] References Cited

U.S. PATENT DOCUMENTS

| | | | |
|---|---|---|---|
| 4,719,636 | 1/1988 | Yamaguchi | 372/50 |
| 4,751,710 | 6/1988 | Yamaguchi et al. | 372/96 |
| 4,813,054 | 3/1989 | Plumb | 372/96 |
| 4,885,753 | 12/1989 | Okai et al. | 372/96 |
| 4,920,542 | 4/1990 | Brosson et al. | 372/96 |

Primary Examiner—Frank Gonzalez
Assistant Examiner—Susan S. Morse
Attorney, Agent, or Firm—Steven R. Biren

[57] ABSTRACT

A tunable semiconductor diode laser with distributed reflection (DBR semiconductor laser) having a wide wavelength range is a suitable transmitter or local oscillator in a receiver in heterodyne and coherent optical glass fiber communication systems. Such a diode includes, in addition to the Bragg section in which the Bragg reflection takes place, an active section in which the radiation-emitting active region is present. When such a semiconductor diode laser is further provided with a so-called phase section, tuning is possible over a large wavelength range within one oscillation mode. A laser which is continuously tunable over the whole wavelength range is obtained by provided a mechanism by which the intensity of radiation which is reflected at the junction between the active section and the phase section is made low with respect to the intensity of the radiation which returns from the phase section to the active section.

9 Claims, 4 Drawing Sheets

TUNABLE SEMICONDUCTOR DIODE LASER WITH DISTRIBUTED REFLECTION

BACKGROUND OF THE INVENTION

The invention relates to a tunable semiconductor diode laser with distributed reflection comprising a semiconductor body in which a first radiation-conductive layer is present on a first passive layer, in which radiation-conductive layer a strip-shaped resonator cavity is formed between two surfaces extending substantially perpendicularly to the said layers and within which are juxtaposed a first section having a first current supply and an associated active region with a p-n junction which at a sufficiently high current strength in the forward direction generates coherent electromagnetic radiation which active region is present within the amplification profile of the radiation-conductive layer, a second section having a second current supply by which the refractive index of a part of the radiation-conductive layer present within the said section can be varied, and a third section having a third current supply, in which the part of the resonant cavity present within the said section comprises a periodic variation of the refractive index in the longitudinal direction.

Such a semiconductor diode layer is described in the article "1.55 $\mu$m wavelength tunable FBH-DBR laser" by Y. Kotaki et al in Electron. Lett. 23 (1987) 327.

Semiconductor diode lasers of a variety of constructions are used in many fields. The resonant cavity can be realized in various manners. In many cases it is formed by two mirror surfaces extending parallel to each other, for which customarily cleavage faces of the semiconductor crystal are used. By repeated reflection against the mirror surfaces radiation modes known as Fabry-Perot (FP) modes are generated.

According to another embodiment the resonant cavity is obtained by a periodic variation of the effective refractive index for the generated radiation along at least a part of the length of the resonant cavity. Instead of reflection against mirror surfaces, reflection at a grating (formed by the said periodic refractive index variation) is used. Lasers in which this is the case are termed lasers with distributed feedback (DFB(=Distributed Feed Back)lasers). They exist in various constructions and are known as "distributed feedback" (DFB) and "Distributed Bragg Reflection" (DBR) lasers, of which the semiconductor diode laser of the first-mentioned article is an example. In the former the section in which the periodic refractive index variation is present coincides substantially with the section in which the active region is present, while in the latter these sections are substantially entirely separated. As compared with the first mentioned Fabry-Perot lasers. Both types of lasers have inter alia the advantage that they can more easily oscillate in one single stable longitudinal mode of oscillation ("single longitudinal mode" or SLM mode) and that within a wide temperature range and at a high output power. This is of importance in particular when used in optical telecommunication since in SLM mode the chromatic dispersion is minimum so that the signal can be transported in a disturbance-free manner over a larger distance through the optical glass fiber. For heterodyne and coherent optical glass fiber communication the tunability of the wavelength of a semiconductor diode laser to be used as a transmitter or as a local oscillator in a receiver is a necessary condition. For such an application the semiconductor diode lasers of the DBR type mentioned in the opening paragraph are excellently suitable. The section with the periodic refractive index variation — hereinafter to be termed Bragg section — in this laser comprises a separate current supply with which the refractive index in said section can be varied so that the Bragg condition and hence the wavelength of the semiconductor diode laser varies. This occurs independently of for example, the output power of the semiconductor diode laser which is determined by the current flowing through the section in which the active region with the p-n junction is situated — hereinafter termed the active section —. The Bragg condition is determined by the following equation $\lambda = 2 * n_R * \Delta$ tm (1) wherein $\lambda$ is the wavelength of the radiation generated by the semiconductor laser, $n_R$ is the effective refractive index of the section with the periodic refractive index variation (which depends on the current strength in the Bragg section) and $\Delta$ is the period of the periodic refractive index variation. The phase condition for oscillation of such a semiconductor diode laser is:
$\theta_R + \theta_L = 2 * N * \pi$ tm (2)

wherein $\theta_R$ is the phase of the radiation which returns from the Bragg section viewed from the active section, $\theta_L$ is the phase of the radiation which returns from the direction of the active section to the Bragg section and N is an integer with which the mode in which the semiconductor diode laser oscillates is characterized. The occurring vibration mode is that mode in which the reflectivity in the Bragg section is maximum. In other words that mode the phase $\theta_R$ of which is as close as possible to $\pi/2$ will be the mode in which the laser oscillates. Associated therewith is a wavelength determined by the Bragg condition (compare 1). When the Bragg wavelength is varied by current supply in the Bragg section and hence the refractive index in the Bragg section varies, a situation arises in which the phase of another mode becomes situated as closely as or even closer to $\pi/2$ than the phase of the original mode. As a result of this the so-called mode oscillation or mode jumping is formed as a result of which the wavelength also starts oscillating, which is undesired. In order to counteract this a further section — hereinafter to be termed phase section — is present in the known semiconductor diode laser and has a separate current supply with which the refractive index in said section and hence the phase $\theta_L$ of the radiation returning from the direction of the active region can be varied in such a manner that the mode in which $\theta_R$ is as close as possible to $\pi/2$, remains equal to the original mode. In this connection it does not matter whether the phase section is present between the Bragg section and the active section or that the phase section and the Bragg section are present on each side of the active section. In both cases tunability over a large wavelength range and within a certain mode of operation is obtained.

Experiments have demonstrated that a disadvantage of the known semiconductor diode laser is that it is not continuously tunable throughout its wavelength range within a mode of oscillation. As a matter of fact it has been found that so-called forbidden zones may occur in the wavelength range, i.e. zones in which oscillation within the given mode occurs in no single pair of currents by the Bragg and phase sections.

SUMMARY OF THE INVENTION

One of the objects of the invention is to avoid this drawback and to obtain a tunable semiconductor diode laser having a wide wavelength range within a certain mode of oscillation in which no forbidden zones occur in the wavelength range and the semiconductor diode laser in that range can hence be tuned continuously. The invention also relates to a method of manufacturing such a semiconductor diode laser.

According to the invention a DBR semiconductor diode laser of the type mentioned above is characterized in that the semiconductor diode laser comprises means with which the relative intensity of said part of the radiation generated in the first section which is reflected at the junction between the first and the second section is made small with respect to the intensity of the radiation returning from the second section to the junction. Further investigations into the occurrence of the forbidden zones have demonstrated that they coincide with the occurrence of reflection of the radiation generated by the laser between the active section and the phase section. The forbidden zones will be in the proximity of a wavelength at which the phase of the radiation with a reciprocation of the active section is $2N^*\pi$ or $(2N+1)^*\pi$, dependent on the sign of the reflection. In both cases the step between two successive forbidden zones is equal to $2\pi$. The influence of the radiation reflected at the junction on the amplification process in the active section can be reduced in two manners: first by making the reflection small or remove it and, second, by increasing the feedback coupling of radiation originating from the second section so that the relative influence on the active section of the reflection at the junction is reduced.

It may be derived that the occurrence of forbidden zones can be characterized by a sine function, for example $A^*\sin(\lambda)$. When the amplitude (A) of said function is zero or substantially zero, no forbidden zones will occur. It may further be derived that said amplitude can be approached by:

$$A = r_1^*(1/r_2^* e^{(-\alpha_F^* L_F)} - r_2^* e^{(-\alpha_F^* L_F)}) \text{ tm (3)}$$

wherein $r_1$ is the reflection at the junction between the first and the second section, $r_2$ is the reflection of said sections which are situated on the same side of the active section as the second section, $\alpha_F$ is the losses in the second (= phase) section and $L_F$ is the length of the second section. It may also be seen with reference to equation (3) that the occurrence of forbidden zones can be prevented in various manners. First of all this can be achieved by a very small value of the reflection at the junction between the first and the second section ($r_1$).

A first embodiment of a semiconductor diode laser according to the invention is characterized in that the means comprises a second radiation-conductive layer which is present on at least one side of the first section at the area of and adjoining the active region with substantially the same thickness as the active region. By making the path of radiation in the second section as much as possible equal to and smoothly adjoining the path of the radiation in the first section substantially no reflection occurs at the junction between the first and the second section.

A second embodiment of a semiconductor diode laser according to the invention is characterized in that the second radiation-conductive layer and the active region are separated from the first radiation-conductive layer by means of a second passive layer. The active region and the second radiation-conductive layer may be provided directly on the first radiation-conductive layer. However, drawbacks are associated with respect to the manufacture. Hence a passive layer is preferably present between the said layers, the thickness of the said passive layer being sufficiently small to satisfy the condition that the layers are situated in each other's amplification profile. It is to be noted that in this embodiment it is possible that both the second and the third section are both situated on one side of the first section and that said sections are situated on each side of the first section. In the latter case there exists an alternative solution for reducing the relative intensity of the reflection at the junction between the first and the second section.

A further embodiment of a semiconductor diode laser according to the invention is characterized in that the first section is present at least substantially in the center of the resonant cavity and the second and third sections are present on each side of the first section and that the means comprise a high-reflecting coating which is provided on one side of the second section which coincides with one of the faces within which the resonant cavity is present. The effect of the suggested solution may also be illustrated with reference to equation (3). A is also zero or substantially zero when the parts placed between brackets is zero or substantially zero. This part has the form $(1/B-B)$ wherein $B = r_2^* e^{(-\alpha_F^* L_F)}$ and will be zero or substantially zero when $B = 1$ or B approaches 1. This is the case when $r_2$ (which is maximally 1) and $e^{(-\alpha_F^* L_F)}$ both are one or substantially one. It appears that in practice $\alpha_F^* L_F$ is very small so that the exponent is substantially one. The reflection $r_2$ can be made substantially equal to 1 by providing a high reflecting coating on the free side of the phase section, i.e. on the side not adjoining the active section. It will be obvious that the means of this embodiment may also be combined with the means or earlier embodiments, at least if the first section is present between the second and the third section.

BRIEF DESCRIPTION OF THE DRAWING

The invention will now be described in greater detail with reference to several embodiments and the drawing, in which FIGS. 5 to 9 show the semiconductor diode lasers according to the invention and in the first embodiment in successive stages of manufacture, in which FIGS. 5, 6 and 7 are cross-sectional views taken on the line II—II, and FIGS. 8 and 9 are cross-sectional views taken on the line VIII—VIII of FIG. 1.

The FIGS. are purely diagrammatic and now drawn to scale. In the cross-sectional views semiconductor regions of the same conductivity type are shaded in the same direction.

DESCRIPTION OF THE PREFERRED EMBODIMENTS

Figure 1:
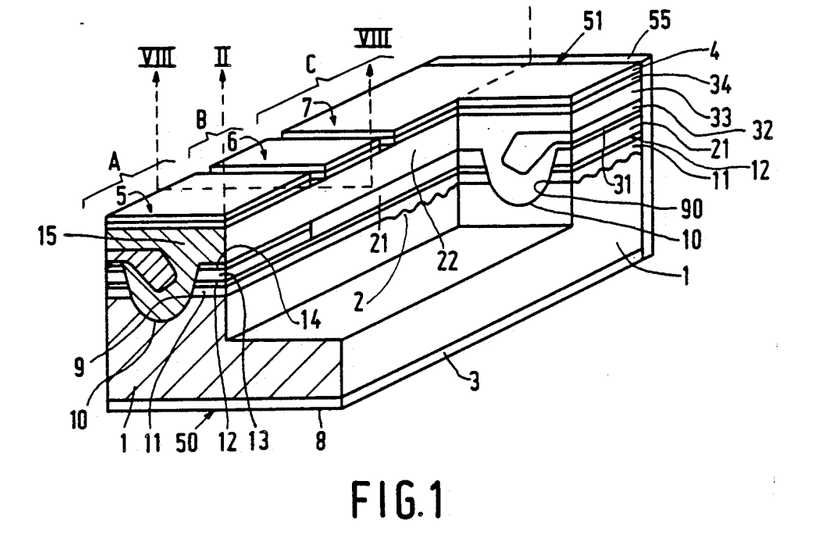
FIG. 1 shows diagrammatically, partly as a perspective view and partly as a cross-sectional view, a first embodiment of a semiconductor diode laser with distributed reflection according to the invention.
Figure 2:
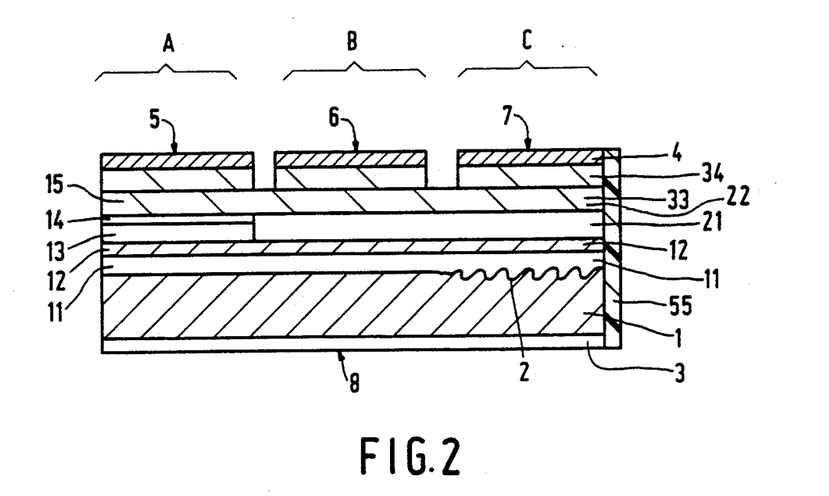
FIG. 2 is a diagrammatic cross-sectional view taken on the line II—II of the semiconductor diode laser of FIG. 1.

FIG. 1 shows diagrammatically, partly as a perspective view and partly as a cross-sectional view, a first embodiment of a semiconductor diode laser with distributed reflection according to the invention. FIG. 2 is a diagrammatic cross-sectional view of the semiconductor diode laser of FIG. 1 taken on the line II—II. The semiconductor diode laser (see FIG. 1) comprises a semiconductor body having a substrate 1 of a fist conductivity type in which at the area of a section denoted by C a periodic variation 2 in thickness is present the lines of which, which connect the peaks and the valleys, extend parallel to the plane of the drawing and on which a laminated structure is present. Said laminated structure comprises inter alia the following regions: on the one hand a mesa-shaped region 9 and on the other hand two regions 90 present beyond two grooves 10, all of which regions are divided on a top side by sections denoted by A, B and C. The mesa-shaped region 9 comprises at least a first radiation-conductive layer 11, a first passive layer 12 of the said first conductivity type, an active layer 13 which is present only at the area of the section A and a second passive layer (15, 22 and 23) of the second opposite conductivity type. In this example a layer 14 is present between the active layer 13 and the second passive layer (15) and serves as an anti-meltback layer. The object of such a layer is to prevent, in the subsequent growth of a subsequent layer from the liquid phases, that the underlying layer dissolves entirely or partly in the liquid phase. Although in that case the presence of such a layer is not strictly necessary, it is very much desired. It will be apparent that when the growth of the above-mentioned layers does not occur from the liquid phase but, for example, from the gaseous phase, an anti-meltback layer is superfluous. The mesa-shaped region 9 furthermore comprises a second radiation-conductive layer 21 present beside the active layer 13 and between the first passive layer 11 and the second passive layer 22. Present between the layers 12 and 15 in the layer structure is a p-n junction, the place of which depends on the conductivity of type of the semiconductor region present between the layers. At a sufficient current strength said p-n junction can generate electromagnetic radiation in the active layer 13 which is coherent in the forward direction, at least at the area of the section A. The substrate 1 and the passive layers 12 and 15, 22 both have for the generated laser radiation a smaller refractive index than the active layer 13 and have a larger energy gap than the active layer 13. The generated radiation can propagate from the active layer 13 into the first radiation-conductive layer 13 which has a refractive index and energy gap which is between that of the active layer 13 and the passive layers (12, 15, 22) since the thickness of the first passive layer 12 is such that the radiation-conductive layer 11 is within the amplification profile of the active layer 13. The generated radiation may also propagate from the active layer 13 into the anti-meltback layer 14 and into the second radiation-conductive layer 21, since they directly adjoin the active layer 13, and like the first radiation-conductive layer, have a refractive index and energy gap between that of the active layer 13 and the passive layers (12, 15, 22). Within the mesa-shaped part 9 the active layer 13, the anti-meltback layer 12 and the radiation-conductive layers 11 and 21 constitute a strip-shaped resonant cavity which is bounded on two sides by two flanks of the mesa-shaped part and on two other sides by two end faces 50 and 51 which extend substantially perpendicularly to the active layer 13 and one of which (face 51) comprises an anti-reflection coating 55 which inter alia serves to prevent as much as possible that competition arises between the Bragg reflection and a reflection at the mirror surface 51. Electromagnetic radiation generated in the laser emanates at the face 51 via antireflection coating 55 and is available for use in various applications of a tunable semiconductor diode laser according to the invention. This latter also applies to the face 50 which for that purpose may also comprise an anti-reflection coating. In optical glass fiber communications the radiation is guided, for example, in a glass fiber. The resonant cavity comprises a periodic refractive index variation in the longitudinal direction over the part of the resonant cavity situated within the section indicated by C. Said refractive index variation is obtained by the grooves of the periodic thickness variation 2 of the substrate 1 filled with material of the radiation-conductive layer 11. The regions 90 comprise a layer structure of which successively the layers 11, 12 and 21 mentioned hereinbefore form part.

The laser according to this example is of the so-called DCPBH (=Double Channel Planar Buried Heterostructure) type and comprises a current limiting layer structure situated in the grooves 10 which are present outside the mesa-shaped region 9. Said layer structure comprises a third passive layer 31 of the second conductivity type, a fourth passive layer 32 of the first conductivity type and a fifth passive layer 33 of the second conductivity type, the layers 31 and 33 being connected to and, near the edge of the mesa-shaped region 9 merge into the second passive layer (15, 22).

The semiconductor body further comprises a contact layer 34 of the second conductivity type. Said layer 34 and the substrate 1 are electrically connected (via the intermediate semiconductor regions) to the metal layers (3, 4) which are provided on the upper and lower surfaces and serve as connection conductor. Metal layer 3 comprises an electric connection 8, the metal layer 4 and the contact layer 34 are divided into three sections (A, B, C) which are separated from each other by two grooves situated between the sections and reaching up to the second passive layer (15, 22, 33) and which sections comprises electrical connections (5, 6, 7). The current in the first section (A), where the electromagnetic radiation is generated, can be adjusted via the connections (5, 8). The current which flows through the sections B and C, i.e., through the second and third connections, can be adjusted via connections 8 and 6 and 8 and 7 and hence the refractive index in said sections. As explained hereinbefore the laser can be tuned continuously or stepwise by the continuous or stepwise variation of the current through the two last mentioned sections.

In this example the substrate 1, the first passive layer 12 and the current limiting layer 32 comprise indium phosphide (InP) of the n conductivity type. The passive layers (15, 22) and the current-limiting layers 31 and 33 also comprise indium phosphide but of the p conductivity type. The remaining layers comprise indium-gallium-arsenic-phosphorus ($In_xGa_{1-x}As_yP_{1-y}$). The values of (x, y) for the radiation-conductive layers 11 and 12, for the anti-meltback layer 14 and for the contact layer 34 are: x=0.72 and y=0.60 and for the active layer 13 they are: x=0.57 and y=0.91. The contact layer 34 is of the p conductivity type, the remaining layers are not intentionally doped. The metal layers 3 and 4 comprise customarily-used metal alloys. The anti-reflection coating 55 comprises customarily-used materials and has a suitable thickness.

According to the invention the semiconductor diode laser comprises means with which the relative intensity of that part of the radiation generated in the first section A which is reflected at the junction between the first and the second section (B) has been made small with respect to the intensity of the radiation returning from the second section tot eh junction. In this example the means are formed by the second radiation-conductive layer 21 which is present on at least one side of the first section (A) at the level of and adjoining the active region 13 in a thickness which is substantially equal to the sum of the thicknesses of the active layer 13 and the anti-meltback layer 14. As a result of this a reflection at the junction between the first section (A) and the second section (B) is suppressed and hence the relative intensity of the radiation which is reflected at the junction becomes low with respect to the intensity of the radiation returning in the first section.

It is to be noted that the first section A may also be placed between the second section B and the third section C. In that case the means may also comprise a further radiation-conducting layer which is present on the other side of the first section at the level of and adjoining the active region 13 with substantially the same thickness as the active region, or — if an anti-meltback layer 14 is present — a thickness which is equal to the sum of the thicknesses of the active layer and the anti-meltback layer.

Figure 3:
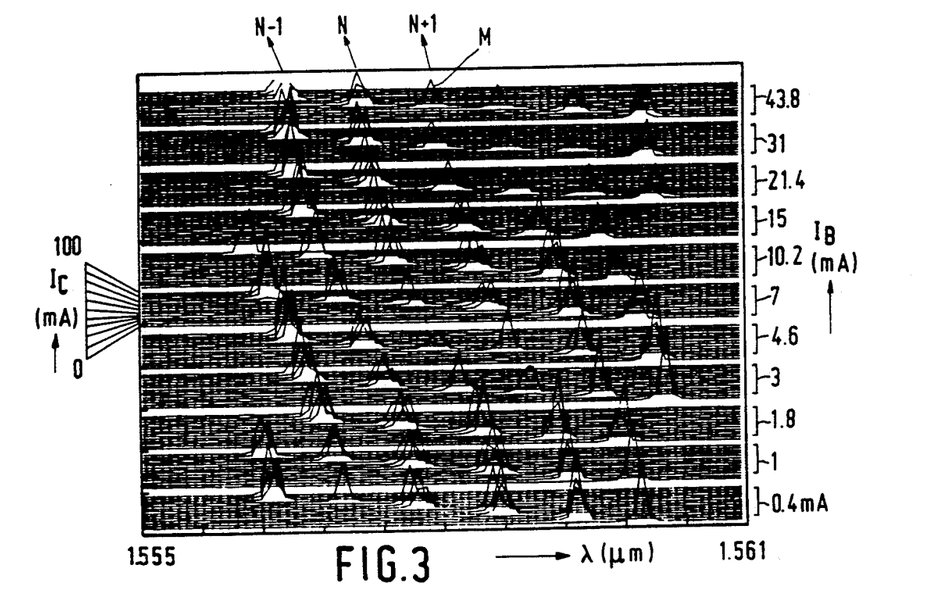
FIG. 3 shows the measured laser oscillations grouped in modes and the associated emission wavelength as a function of the current through the second ($I_B$) and the third ($I_C$) section of the semiconductor diode laser of FIG. 1.
Figure 4:
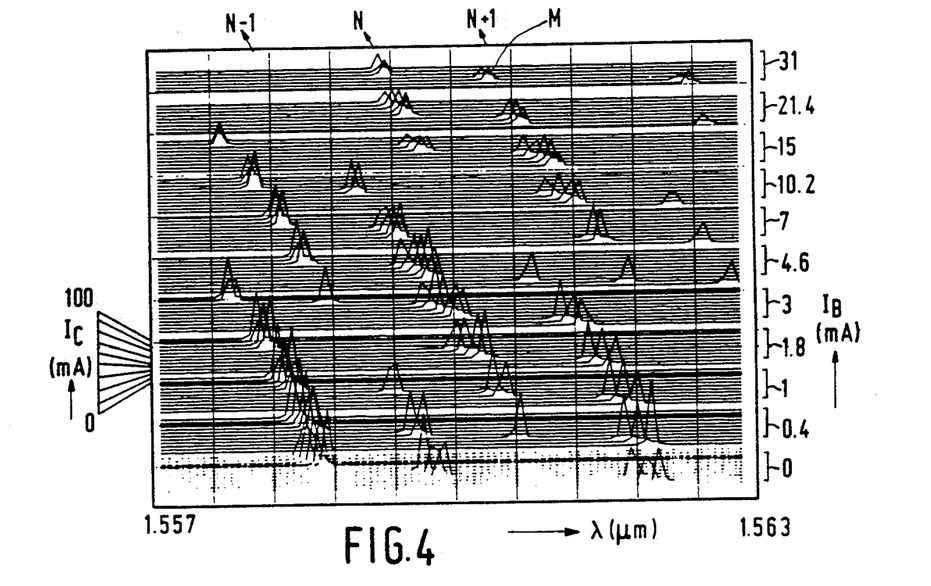
FIG. 4 shows the measured laser oscillation grouped in modes and the associated emission wavelength as a function of the current through the second ($I_B$) and the third ($I_C$) section of a semiconductor diode laser according to the prior art.

FIG. 3 shows the measured laser oscillations grouped in modes and the associated emission wavelength as a function of the current through the first section ($I_B$) and the third section ($I_C$) of the semiconductor diode laser of FIG. 1. FIG. 4 shows similar characteristics for a prior art semiconductor diode laser. In the Figures an arbitrary individual oscillation is denoted by M. It is present on a linear mode denoted by N+1. The associated emission wavelength ($\lambda_1$) is found by projection from M on the horizontal (=λ) axis. The associated current through the second section ($I_B$) can be read on the right hand vertical axis behind that brace which comprises the horizontal line through the base of oscillation M. Ten such lines are present within each brace. The current through the third section ($I_C$) is shown on the left hand vertical axis for each of the said lines: for each value of $I_B$ said current increases stepwise from 0 to 100 mA with a step value of 10 mA. FIG. 3 shows that a tunable semiconductor diode laser according to the invention and of the FIG. 1 embodiment is substantially continuously tunable within a mode, for example the mode indicated by N+1. The tuning range of a prior art semiconductor diode laser on the contrary in which the second radiation-conductive layer 21 is absent, shows within a mode, for example N, zones indicated by G in which no stable oscillation M is possible, as is clearly shown in FIG. 4. These Figures demonstrate that a semiconductor diode laser according to the invention can be considerably better tuned within a mode, which, as already explained hereinbefore, is of great advantage for many applications.

Figure 5:
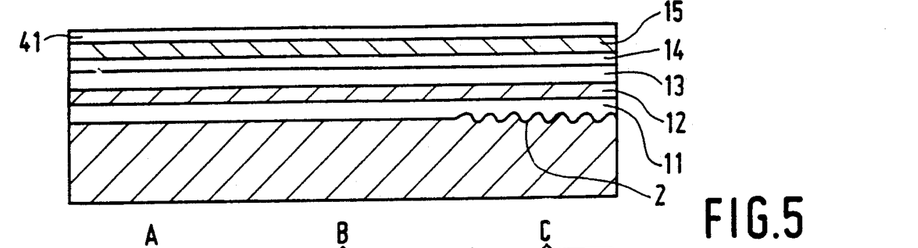
Figure 6:
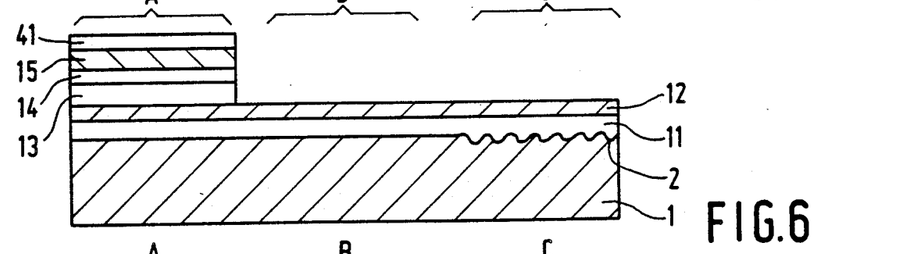
Figure 7:
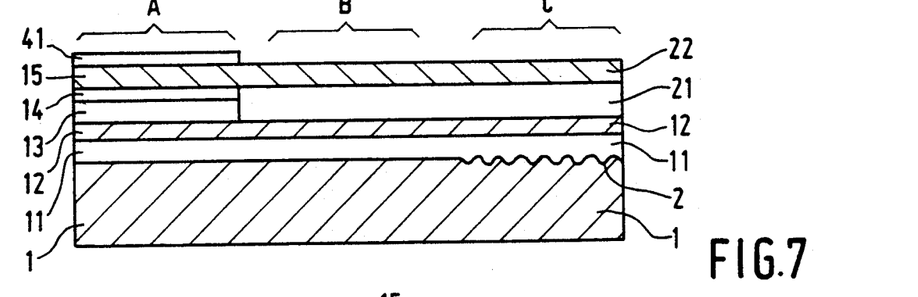
Figure 8:
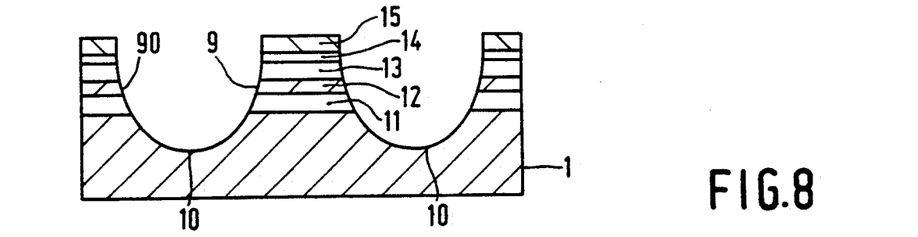
Figure 9:
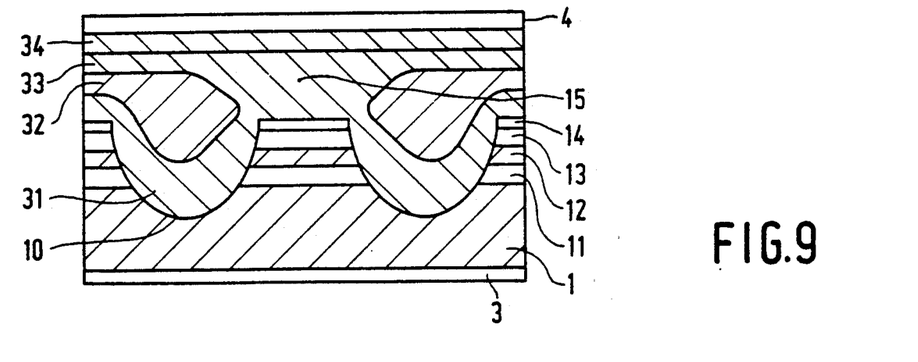

The semiconductor diode laser described of this example can be manufactured as follows. See FIGS. 5 to 9 in which FIGS. 5 to 7 are cross-sectional views taken on the line II—II of FIG. 1 and FIGS. 8 and 9 are cross-sectional views taken on the line VIII—VIII of the same Figure.

Starting material is a substrate 1 of n type indium phosphide in a thickness of approximately 360/μm, a (100) orientation and a doping concentration of, for example, $5 \times 10^{18}$ atoms per $cm^3$. This substrate may be a single substrate but may also be formed by an epitaxial layer grown on an underlying carrier body.

In the top surface of said substrate 1 a diffraction grating 2 is etched (see FIG. 5) with a grating constant of approximately 240 nm. For that purpose, first a layer of photolacquer is provided on the top surface in a thickness of approximately 100 nm. A raster-like pattern is formed from said photolacquer layer by means of holographic exposure using the 363.8 nm line of an argon laser. This pattern is used as a mask in an etching process in which a pattern 2 of parallel grooves is etched in the top surface of the substrate, for example by means of a solution of hydrobromide (HBr) and bromine ($Br_2$) in water with a composition in which $H_2O:HBr:Br_2 = 60:30:1$ in water.

After removing the photolacquer mask an approximately 0.2 μm thick layer 11 of the composition $In_{0.72}Ga_{0.28}As_{0.60}P_{0.40}$ is grown from the liquid phase by means of conventional techniques and fills the grooves 2 in the substrate surface entirely. An approximately 0.1 μm thick layer 12 of indium phosphide which has not been doped intentionally is grown thereon. An approximately 0.15 μm thick layer 13 of not intentionally doped $In_{0.57}Ga_{0.43}As_{0.91}P_{0.009}$, a 0.05 μm thick not intentionally doped anti-meltback layer 14 of $In_{0.72}Ga_{0.28}A_{0.60}P_{0.040}$ and a 0.7 μm thick indium phosphide layer having a doping of $1 \times 10^{18}$ Zn atoms per $cm^3$ are then grown. After these growing processor the depth of the raster grooves 2 in the InP substrate is approximately 40 nm. A mask layer 41 of silicon dioxide ($SiO_2$) is then deposited over the structure by means of, for example, sputtering.

The said layer 41 (see FIG. 6) is then removed in the usual manner at the area of the sections B and C to be formed after which the semiconductor layer structure is etched away down to layer 12 at the area of the sections B and C to be formed using the remaining part of layer 41 as a mask. Layer 12 serves as an etch stopping layer.

After cleaning in any conventional manner the resulting structure is again placed in the growing apparatus and a number of semiconductor layers are grown locally using the remaining part of layer 41 as a mask (see FIG. 7). First a 0.20/μm thick layer 21 of $In_{0.72}Ga_{0.28}As_{0.60}P_{0.40}$ which has not been intentionally doped and then an approximately 0.8/μm thick layer 22 of indium phosphide with a doping $1 \times 10^{18}$ Zn atoms per $cm^3$. This latter layer substantially adjoins homogeneously the passive layer 15 and with the said layer forms one semiconductor region of the same composition, of the same conductivity type and having a substantially flat top side.

After the resulting structure has been removed from the growing apparatus, layer 41 is removed and the structure has been cleaned, the mesa-shaped body 9 is formed by means of photolacquer, photolithography and conventionally used etchants by etching two grooves 10 (see FIG. 8) the longitudinal axis of which is perpendicular to the grooves 2 (see also FIG. 1). The width of the mesa-shaped body, measured on the top side, is approximately 0.9/μm. After removing the photolacquer and after cleaning, the structure thus obtained is again placed in the growing apparatus and a number of semiconductor layers are grown (see FIG. 9). First a p type indium phosphide layer 31 is grown having a doping of $8 \times 10^{17}$ Zn atoms per $cm^3$ and thereon an n type blocking layer 32 of indium phosphide having a doping of $8 \times 10^{17}$ Ge atoms per $cm^3$. Said layers fill the grooves 10 partly or entirely but do not grow on the mesa-shaped region 9. This is associated with the fact that the method of growing used here comprises the growing from the liquid phase, the geometry of the structure and the time in which the layers are grown. In the regions 90 the layer 31 merges into the layer 15.

A p type indium phosphide layer 33 having a thickness of, for example 1/μm, and a doping concentration of $1 \times 10^{18}$ Zn atoms per $cm^3$, and a p type contact layer 34 having the composition $In_{0.72}Ga_{0.28}As_{0.60}P_{0.40}$, a thickness of 0.5/μm and a doping concentration of $1 \times 10^{19}$ Zn atoms per $cm^3$ are then grown. Above the mesa-shaped region 9 the layer 33 merges smoothly into the layers 15 and 22 (see also FIG. 2).

After having removed the resulting structure from the growing apparatus, metal layers 4 and 3 of a conventionally used composition are provided in the usual manner on the top and lower sides of the semiconductor body (see FIG. 2) on which current connections can be made.

If desired, before providing metal layer 4 further current limiting measures may be taken. For example, a zinc diffusion may locally be carried out in the surface above the mesa-shaped part 9 or an implantation with H+ions may be carried out beyond the said part as a result of which the semiconductor body becomes high ohmic at the area of the said implantation. A local zinc diffusion will notably be useful when the doping concentration of contact layer 34 is lower than in the example shown here.

Finally (see FIG. 2) two groove are etched in the top side of the semiconductor body as a result of which the sections A, B and C can be provided with separate current supplies 5, 6 and 7, respectively. These grooves which extend parallel to the grooves of the grating 2 can be provided in the conventionally used method by means of photolithography and etching. They reach down approximately into the layer 33. By means of, for example, sputtering or vapor deposition an anti-reflection coating 55 is provided on one of the side surfaces of the semiconductor body. The electromagnetic radiation emanating from said side surface can be guided in a glass fiber.

Figure 10:
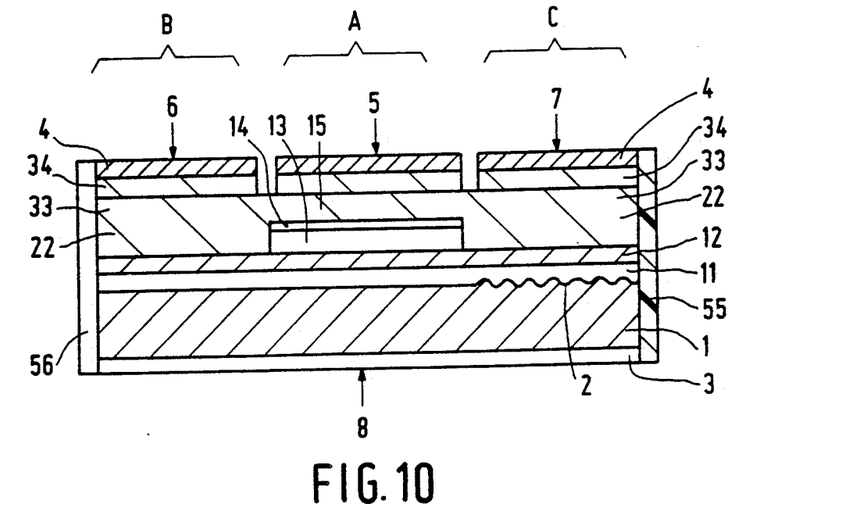
FIG. 10 is a diagrammatic cross-sectional view taken on the line II—II of FIG. 1 of a second embodiment of a semiconductor diode laser with distributed reflection according to the invention.

FIG. 10 is a cross-sectional view taken on the line II—II of FIG. 1 of a second embodiment of a semiconductor diode laser according to the invention. The regions corresponding to FIG. 2 have the same reference numerals and are otherwise equal and as far the description thereof is concerned reference is made to the first example. The most important differences relate to the fact that the active layer 13 and the anti-meltback layer 14 are present in the center of the cross-section and that a second radiation-conducting layer (layer 21 in FIG. 2) is not present.

The semiconductor diode laser according to the invention is in this example provided with means with which the relative intensity of that part of the radiation generate din the first section (A) which is reflected at the junction from the first to the second section (B) has been made small with respect to the intensity of the radiation returning from the second section to the junction.

In this example the means are formed by a high reflecting coating 56 provided on the side face of the semiconductor body adjoining the second section (B). By providing the side face with an anti-reflection coating 55 electromagnetic radiation emanates which is available for use in the application in question. Due to the presence of the high reflecting coating the intensity of the radiation returning from the second section B to the first section A is considerably increased. As a result of this the relative intensity of a reflection in the first section A at the junction from the first to the second section becomes lower with respect to the first mentioned intensity. As a result of this the occurrence of forbidden zones in the turning range within a mode is suppressed or restricted as was already described in the introductory part of the specification.

The high reflecting coating in this example comprises eight layers which alternately comprise silicon dioxide ($SiO_2$) and hafnium oxide ($HfO_2$) each having a thickness corresponding to one quarter of a lambda which is approximately 276 nm for the first and 220 nm for the second material as a result of which the overall thickness of the coating is approximately 2/μm.

Figure 11:
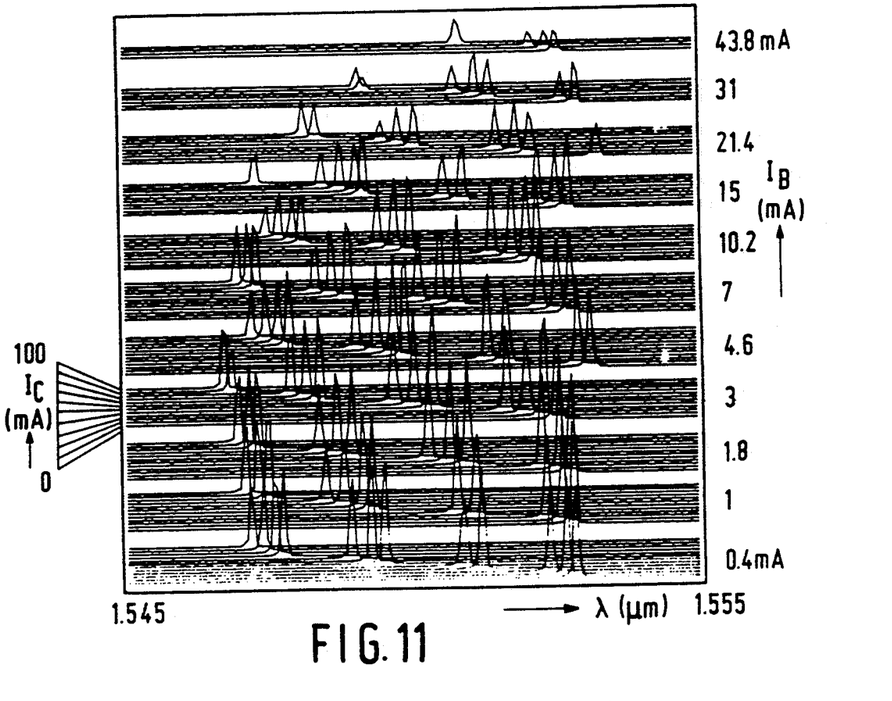
FIG. 11 shows the measured laser oscillations grouped in modes in the associated emission wavelength as a function of the current through the second ($I_B$) and the third ($I_C$) section of the semiconductor diode laser of FIG. 10.

FIG. 11 shows the measured laser oscillations grouped in modes and the associated emission wavelength as a function of the current through the second ($I_B$) and the third ($I_C$) section for the semiconductor diode laser in the embodiment with which FIG. 10 corresponds. This Figure has a strong resemblance with FIG. 3 and comparison with FIG. 4 (prior art) demonstrates that in this example also substantially continuous tunability within a mode is possible and that no or substantially no forbidden zones occur.

As regards the manufacture of the semiconductor diode laser of the second example reference is made to the method of manufacturing the first example. The difference relates to the non-growing of a second radiation-conductive layer and making the mutual positioning of the three sections by means of masks suitable for that purpose so that the first section (A) lies centrally between the two other sections (B) and (C).

In a third embodiment the means to make the intensity of that part of the radiation generated in the first section A and reflected at the junction between the first and the second section (B) small with respect to the intensity of the radiation returning from the second section to the junction may comprise both the means of the first and the means of the second example. On the basis of what was discussed in the previous examples it will be obvious that of such a combination equally favourable properties or even more favourable properties may be expected.

The invention is by no means restricted to the embodiments described, since various combinations and modifications will be apparent to those skilled in the art. For example, it is possible inter alia to omit the first passive layer 12 in all the said examples. Although a few advantages and drawbacks are associated with the remaining properties of the semiconductor diode laser according to the invention and for the manufacture thereof, this has no consequences for the favorable effect endeavoured by the invention. Furthermore, the semiconductor diode laser may also be formed without an anti-meltback layer. A so-called BH (=Bured Hetero) structure may also be used for the structure of the semiconductor diode laser instead of a DCPBH structure. In this case not two grooves but two lower-situated semi-infinite surfaces are present beside the mesa part. In such a structure the mesa part will usually also be wider than in a DCPBH structure. Due to both differences growth on the mesa will take place more easily. For this reason the mesa will hence often be coated with, for example, silicon dioxide in those process steps in which no growth on the mesa is desired.

The composition of a radiation guiding layer has to be chosen in such a manner that the radiation from the active layer is well guided. In principle many compositions can be used for the radiation guiding layers. It was found however that the composition preferably differs not much from the composition of the active layer. For example, in the case where the composition of the active layer corresponds to an emission wavelength of about 1.3/μm, best results were obtained with a composition for the radiation guiding layers that corresponds to an emission wavelength of about 1.2/μm.

Numerous modifications are also possible as regards the manufacture of a semiconductor diode laser according the invention. For example, one or more layers can be grown with other epitaxial methods than that from the liquid phase.

We claim:

1. A tunable semiconductor diode laser with distributed reflection comprising a semiconductor body having a passive layer and in which a first radiation-conductive layer is present on said first passive layer and in which a strip-shaped resonant cavity is formed between two surfaces extending substantially perpendicularly to said layers and within which resonant cavity are juxtaposed a first section having a first current supply and an associated active region with a p-n junction which at sufficiently high current strength in the forward direction generates coherent electromagnetic radiation, which active region is situated within the amplification profile of the radiation-conductive layer, a second section having a second current supply by which the refractive index of a part of the radiation-conductive layer present within said second section can be varied, and a third section having a third current supply in which the part of the resonant cavity present within the said third section comprises a periodic variation of the refractive index in the longitudinal direction, characterized in that the semiconductor diode laser comprises means for making the relative intensity of that part of the radiation generated in the first section which is reflected at the junction between the first and the second section small with respect to the intensity of the radiation returning from the second section to the junction.

2. A semiconductor diode laser as claimed in claim 1, characterized in that said means comprises a second radiation-conductive layer which is provided on at least one side of the first section at the level of and adjoining the active region with substantially the same thickness as the active region.

3. A semiconductor diode laser as claimed in claim 2, in which an anti-meltback layer is provided above the active region, characterized in that said means comprises a second radiation-conductive layer which is provided on at least one side of the first section at the area of and adjoining the active region with a thickness which is substantially equal to the sum of the thicknesses of the active region and the anti-meltback layer.

4. A semiconductor diode laser as claimed in claim 2 or 3, characterized in that the second radiation-conductive layer and the active region are separated from the first radiation-conductive layer by a second passive layer.

5. A semiconductor diode laser as claimed in claim 2 or 3 characterized in that the first, second and third sections are present in the recited sequence between the surfaces which bound the resonant cavity.

6. A semiconductor diode laser as claimed in claim 2 or 3, characterized in that the first section is located at least substantially in the center of the resonant cavity and the second and third sections are situated on each side of the first section.

7. A semiconductor diode laser as claimed in claim 1, characterized in that the first section is located at least substantially in the center of the resonant cavity and the second and third sections are situated on each side of the first section and that the means comprise a high reflecting coating provided on one side of the second section which coincides with one of the surfaces within which the resonant cavity is situated.

8. A semiconductor diode laser as claimed in claim 1, 2 or 3, characterized in that the first section is of the BH (Buried Hetero structure) type.

9. A semiconductor diode laser as claimed in claim 1, 2 or 3, characterized in that the first section is of the DCPBH (Double Channel Planar Buried Hetero structure) type.

* * * * *